United States Patent
Steijer et al.

(10) Patent No.: US 6,172,425 B1
(45) Date of Patent: *Jan. 9, 2001

(54) ENCAPSULATION OF TRANSMITTER AND RECEIVER MODULES

(75) Inventors: Odd Steijer, Bromma; Josef Bakszt, Huddinge; Paul Eriksen, Tyresö, all of (SE)

(73) Assignee: Telefonaktiebolaget LM Ericsson (publ), Stockholm (SE)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/959,624

(22) Filed: Oct. 28, 1997

Related U.S. Application Data

(63) Continuation of application No. PCT/SE96/00554, filed on Apr. 26, 1996.

(30) Foreign Application Priority Data

Apr. 28, 1995 (SE) .................................................. 9501593

(51) Int. Cl.⁷ .................................................. H01L 23/28
(52) U.S. Cl. .......................... 257/787; 257/433; 257/692
(58) Field of Search .................................. 257/787, 668, 257/692, 696, 433, 99; 385/83

(56) References Cited

U.S. PATENT DOCUMENTS

| | | | |
|---|---|---|---|
| 5,199,093 | 3/1993 | Longhurst | 385/88 |
| 5,245,215 | 9/1993 | Sawaya | 257/676 |
| 5,245,216 | 9/1993 | Sako | 257/676 |
| 5,406,027 | 4/1995 | Matsumoto et al. | 174/52.2 |
| 5,818,990 | * 10/1998 | Steijer et al. | 385/49 |

FOREIGN PATENT DOCUMENTS

| | | |
|---|---|---|
| 0 596 613 | 5/1994 | (EP) . |
| 0 600 645 | 6/1994 | (EP) . |
| WO95/25974 | 9/1995 | (WO) . |
| WO96/13068 | 5/1996 | (WO) . |
| WO96/13069 | 5/1996 | (WO) . |

* cited by examiner

Primary Examiner—Roy Potter
(74) Attorney, Agent, or Firm—Burns, Doane, Swecker & Mathis, L.L.P.

(57) ABSTRACT

An encapsulated optocomponent has an optocomponent assembly having an optical interface at one side, which has guide pins for positioning a connected optical component or optical connector. The assembly is attached to the outermost portion of a flexible tongue, which is an integral part of a dielectric carrier such as a polymer carrier. On or inside the carrier and the tongue thereof electrical conductive paths are arranged which are connected to the optoassembly and to electrical driver circuits in a driver circuit assembly, so that the carrier also has the function of a conventional lead frame. The entire device is molded into encapsulating plastic material. In the molding operation the positioning of the optoassembly in an accurately determined position and the retainment thereof in this position is facilitated by the flexibility of the tongue, not being affected for example by the fact that an injected encapsulating material may possibly displace the significantly larger driver circuit assembly and its attachment area on the carrier. This construction can also allow that only the optoassembly is encapsulated, the driver circuit assembly being protected in some other way, so that the flexible tongue is exposed. This design can facilitate the accurate positioning of the optocomponent assembly on a circuit board.

3 Claims, 3 Drawing Sheets

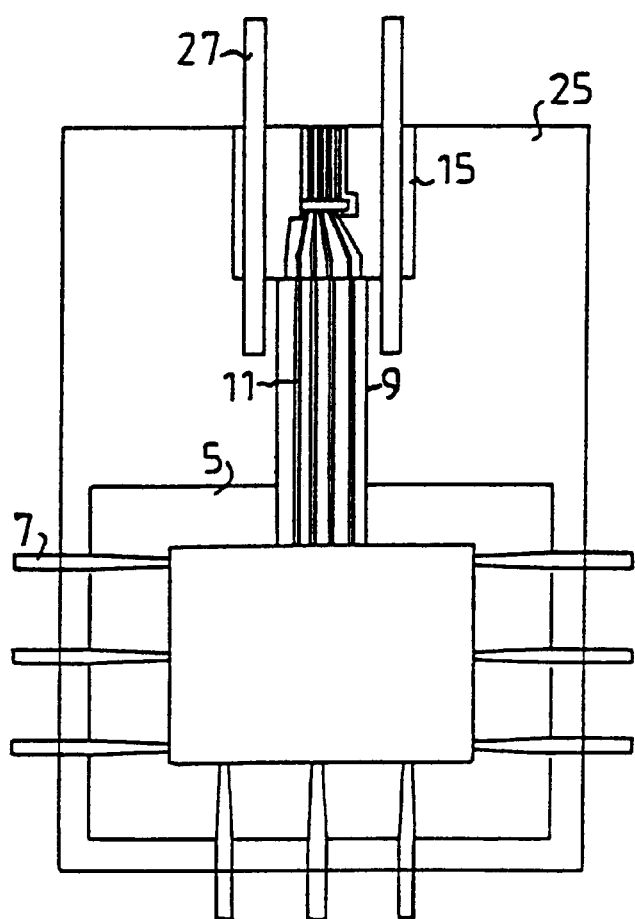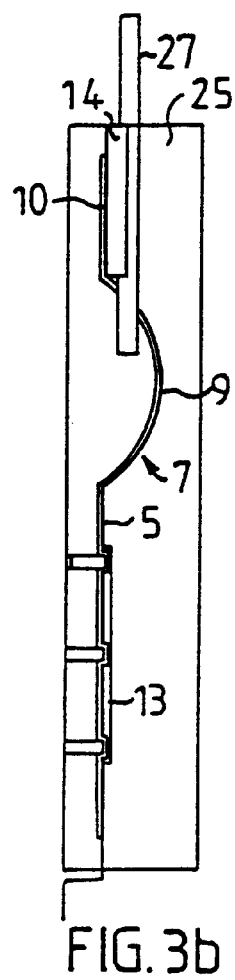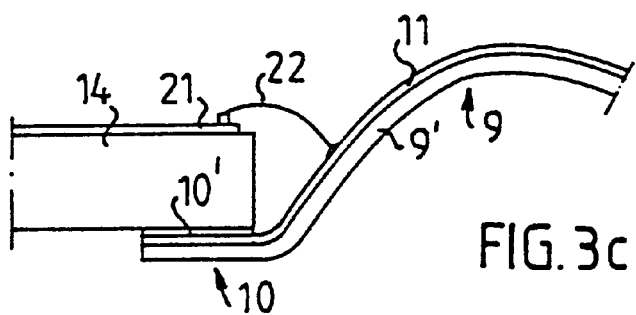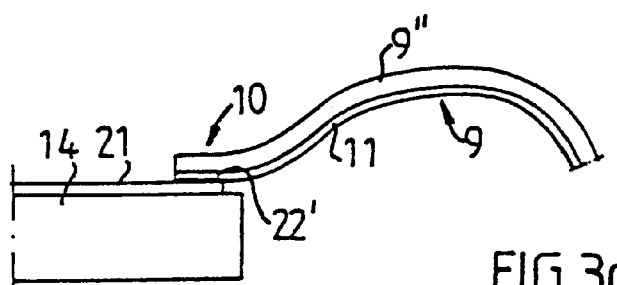

ENCAPSULATION OF TRANSMITTER AND RECEIVER MODULES

This application is a continuation of International Application No. PCT/SE96/00554, filed Apr. 26, 1996, which designates the United States.

TECHNICAL FIELD

The present invention relates to encapsulation of or packaging, with a resin or plastic material, optical transmitter and receiver modules comprising optocomponents on silicon substrates and generally encapsulated optoelectrical components and methods for the manufacture thereof.

BACKGROUND

Encapsulated optocomponents with associated wave guides, connection devices, etc. are at present expensive, which is an obstacle for a more widespread introduction of the optical communication technology. One of the major reasons for the high component cost is the extreme requirements on mechanical precision in the alignment of an optoelectronic component with a waveguide and of a waveguide in a component with another waveguide. The mounting methods of today do not allow electronic circuits to be contained or housed, in a functional and efficient manner, in the package and/or be mounted efficiently together with the optoelectronic component on a circuit board.

Having access to a common "micro construction method" for optical and microelectronic devices the conditions would be improved in order to allow fabrication of optical transmitter and receiver modules at a low cost, thereby opening new applications and markets for optical communication.

At present an intensive development work within the microstructure technology is pursued in order to achieve a possible way of positioning devices with an accuracy of the magnitude of order of one micrometer. One of the aims of this work is to replace the costly details, which are today used in the mounting of optocomponents, with mass produced details of for instance silicon.

In parallel there is a development towards more efficient methods for mounting and encapsulating integrated optical devices. One obvious development path is the use of polymer films, usually polyimide films, for this object. Since production of conductive leads using coating and etching can be carried out on such films and sandwich constructions having several layers comprising electrical conductors and ground planes ("multilayer technique") are used, making impedance matching possible, several chips can be mounted together with each other having no additional demands on substrates or base materials. Moreover, when encapsulated with resin such a polymer film can take over the function of the traditional lead frame made of thin metal plate. Metallic or possibly metallized connection legs may protrude from the capsule wall from the carrier film in order to accomplish the electrical connection of the electronic circuits to the exterior. Also exterior metallized surfaces like those used in TAB-mounting can be present.

Flexible resin tape having lead portions can be used in an electronic multichip package as disclosed in U.S. Pat. No. 5,245,215. The flexibility of the tape is primarily used for allowing a dense packing of the chips.

In the International patent applications PCT/SE95/00281, filed on Mar. 20, 1995, PCT/SE95/01232, filed on Oct. 19, 1995, and PCT/SE95/01233, filed on Oct. 19, 1995 for the same applicant/assignee methods for encapsulating optoelectrical components with resin or plastic materials at a low cost are described. The methods rely on the fact that a substrate for hybrid mounted optocomponents is positioned with a high accuracy in a mould cavity to be overmoulded with plastics. The optocomponent is encapsulated by means of transfer moulding, whereby an optical interface in the capsule wall is obtained simultaneously by means of V-grooves on the substrate and guide pins in the mould. An electrically conducting lead frame can be used for establishing electrical contact with the electronic circuits. The lead frame usually consists of a punched or etched metal detail, for instance a thin copper or aluminium sheet.

Simultaneous encapsulation, with plastics, of optocomponents and electronic circuits with a positioning of waveguides and optoelectrical components on substrates of silicon is previously known.

Thus, in the published European patent application EP-A1 0 600 645 an optoelectronic module encapsulated with plastics and of SIP type ("Single In-line Package") is disclosed comprising electronic components and optocomponents placed on a silicon substrate.

In the published European patent application EP-A2 0 596 613 a coupling module for coupling optical fibres 6 to an "optical unit", or rather to an "electronic part" through an "optical unit" is described. The optical unit may comprise a base 13 of possibly silicon having electrodes and microlenses 4a and photodetectors 4, see FIGS. 6a–7b. The optical unit is connected to the electronic part, which can be an integrated semiconductor circuit, for instance by means of wire bonding between the electrodes on the support base plate 13 and conductive areas 9a on the electronic part 9 (FIGS. 5a and 5b). However, this coupling module is not encapsulated with plastics.

SUMMARY

It is an object of the invention to provide an encapsulated optocomponent and a method for manufacturing it, which allow electronic signal and driver circuits to be accommodated in the capsule in a functional and efficient manner.

It is another object of the invention to provide an encapsulated optocomponent and a method of manufacturing it, which allow electronic circuits to be placed together with the optoelectronic component on a circuit board in a simple and functional way.

These objects are achieved with the invention, the scope and characteristics of which appear from the appended claims.

Hence, in one embodiment, in a manner functional for encapsulation with plastics, also electrical circuits such as for instance receiver/driver electronic circuits can be placed inside the capsule. Hereby more compact modules can be obtained by the fact that the entire encapsulated component occupies less space on the circuit board, and that standardized electrical interfaces to the encapsulated optomodule can be obtained. The designer of the circuit board does not need to particularly consider the fact that the capsule contains optocomponents when designing a new circuit board. The short distance between the electronic circuits and the optoelectrical converter provides short current paths and thereby a possibility for high modulation speeds.

If the substrate or base plate mentioned above in connection with the state of the art, that is often provided in the shape of a silicon plate, in addition to the optocomponents is also to contain the necessary electronic devices, it becomes considerably larger, as is obvious from the disclosure in the above mentioned European patent application EP-A1 0 600 645. This will make the positioning of the base plate in the mould cavity more difficult, since larger forces will be required in order to maintain the substrate in the exactly correct position. This is particularly evident in filling a mould cavity with resin for the encapsulation of the component, since large forces will then act on the substrate and can move it from its accurately determined position. The substrate in the shape of a silicon plate is also comparatively expensive as counted per unit area, due to the often extensive processing technology used in fabricating it, and then one of course aims at as small substrates as possible.

For these reasons the electronic circuits are mounted on a special carrier or base plate, which is mechanically separated from a carrier or base plate for the optocomponent or is at least not rigidly connected to the carrier or base plate of the optocomponent.

It can also be desirable to provide a certain modularity between optocomponents and electronic components due to test methods and changes in different steps in the manufacture of carriers for the components and in the encapsulation, which can also be obtained by providing separate carriers or carrier portions for optical components and purely electrical units respectively.

One such optocarrier can be used, which is hybrid type and is known from the above described prior art, see the schematic perspective view in FIG. 1 that is a relatively small high-precision detail of for instance monocrystalline silicon having integrated waveguides or waveguides arranged thereupon and comprising optoelectrical components arranged on the surface of the optocarrier. Such an optocomponent assembly in the shape of an optocarrier or optical support plate comprising waveguides and an optoelectrical component is connected to and attached to a corresponding carrier area of a thin film carrier, which comprises electronic circuits for driving, reception, transmission, regulation, etc. attached and electrically connected thereto. Thereby, a composite unit is obtained suitable for at least partial encapsulation with plastics.

The electrical and mechanical connection of the thin film carrier having driver electronic devices mounted thereon is obtained by means of a flexible tongue, which is a portion of the thin film carrier. The tongue can, with its outermost part, be adhesively bonded to for example the underside of the optocomponent, so that they, together with each other, can be handled as one unit. In connection therewith or thereafter the electrical connection can be made between electrodes such as suitable electrically conducting surfaces on the optocomponent and electrical conductors on the tongue by means of some suitable method, such as for instance similar to the "flipchip" method having islands or "bumps" of a metallic solder or a conducting adhesive. Alternatively loose conducting wires can be used with wire bonding—friction welding of the wires and the different electrically conducting surfaces.

When the encapsulation is made, i.e. when a plastic or resin material is injected into a suitable mould cavity, in which at least one carrier, of which the tongue is a part, is placed, the mechanical flexibility of the tongue is used for and makes the positioning of the optocarrier possible at its accurately determined position. The mechanical flexibility of the tongue is due to the fact that the tongue can be considerably more narrow and/or thinner than the areas of the carrier, from which it extends, and in particular from the areas, which are intended for one or both of the optocomponent assemblies and electronic circuit. The optocarrier plate is thus here freely suspended and attached to the tongue.

In one embodiment the electronic circuits can be placed outside the package, so that it encloses the optocomponent assembly except its front side, where an optical interface is located. The electronic circuits can then be protected by means of "globe-top" encapsulation. The advantage of a capsule thus designed is that the well encapsulated optoportion of the module is mechanically flexible in relation to the electronic portion attached to the circuit board, what can considerably facilitate connection of the optical part to another optodevice that is rigidly mounted to the same circuit board.

Thus generally, an optocarrier or optical support plate of preferably silicon having waveguides, optoelectrical components such as an LD-array and electrodes is connected electrically and mechanically to a thin film carrier having driver electronic circuits by means of a "flexible tongue" being preferably part of the thin film carrier. The tongue is first adhesively bonded to the one side, e.g. the underside, of the optocarrier and is then electrically connected by means of e.g. wire bonding between the electrodes of the optocarrier and electrical conductors on the tongue. Thereafter encapsulation with plastics of the entire unit or of the entire unit except the electronic circuits is made, i.e. as an alternative the electronics can be placed outside the capsule.

An encapsulated optoelectrical component hence comprises an optocomponent assembly. The assembly can have an optical interface at one of its sides or surfaces and further areas for electrical connection, which can be located next to an opposite side or surface. Furthermore, a carrier such as a suitably configured sheet or film is provided essentially consisting of an insulating material having different areas or fields, which can be located on the same surface thereof. One area or field is provided for attachment of the optocomponent assembly and next to this area there are suitable connection areas of electrical conductors for electrical connection with areas on the optocomponent assembly and for electrical connection to the outside. An encapsulating enclosure encloses at least the major portion of the optocomponent assembly. One portion of the carrier connects the area of the carrier for attachment of the optocomponent assembly to the remaining part of the carrier and this part is flexible, at least in the upwards and downwards directions, that is perpendicularly to a plane through the other portions of the carrier. In particular the area, where the flexible portion is connected to the remaining portion, can be an area for attachment of an electric circuit unit. Then, for this, also electrical conductors on the carrier are provided for electrical connection to areas on the electrical circuit unit.

The optocomponent assembly itself can advantageously comprise mechanical guide devices for positioning the assembly in relation to another optical device having corresponding guide devices, for instance parallel guide grooves formed on the optocomponent assembly for engagement with guide pins.

The flexible portion can be a part of the carrier, which is considerably more narrow than the edges of at least one of those attachment areas of the remaining portion of the carrier, to which the portion is connected, and/or is considerably thinner than such an area, so that stronger areas exist on the carrier, whereby this obtains a sufficient stiffness and stability of its own when being handled.

On the flexible portion suitable electrical conductors are provided for powering and communication with the optocomponent, such as conductors for electrical driver voltages to and signals to and/or from the optocomponent assembly.

DESCRIPTION OF THE DRAWINGS

The invention will now be described in detail by way of nonlimiting embodiments with reference to the accompanying drawings, in which:

FIG. 3a shows, in a plan view, the thin film carrier according to FIG. 2, placed in a mould cavity or a capsule also having an optocomponent carrier arranged thereon and guide pins, FIG. 3b shows the thin film carrier according to FIG. 3 as seen in an elevational view, FIGS. 3c and 3d show, in elevational views, two different possibilities for the connection of the thin film carrier to the optocomponent carrier.

DETAILED DESCRIPTION

Figure 2:
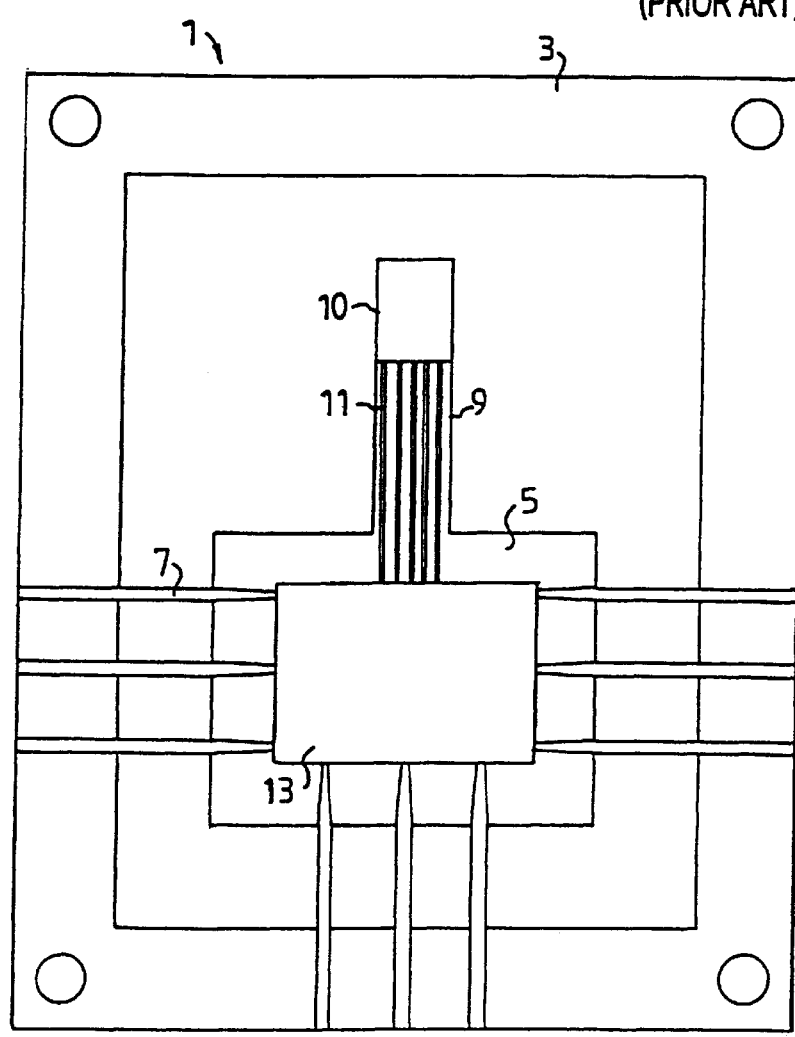
FIG. 2 shows a plan view of a thin film carrier having electronic circuits mounted thereupon.

In FIG. 2 a thin film carrier 1 made essentially of a dielectric or insulating, polymer material, such as a polyimide film, is shown. It has a generally rectangular shape or contour. A frame portion 3 of the carrier 1 has a substantially uniform width and extends around the periphery of the carrier. Inside the frame 3 a carrier area 5 is provided for electronic circuits and it has the shape of a rectangular field or portion having edges parallel to the outer edges of the carrier 1. The upper surface and surface layer of the electronic circuit carrier area 5 is not electrically conducting. From regions of three edges or sides of the electronic circuit carrier area 5 electrical conductors or legs 7 extend out to the frame part 3 for electrical connection of electronic circuits. The legs 7 comprise a suitable electrically conducting material, for instance coated on portions of the base film constituting the thin film carrier 1. Thus there is one fourth edge of the electronic circuit carrier area 5, from which no electrically conducting legs 7 extend. At this fourth edge a flexible tongue 9 is arranged having an essentially uniform width being significantly smaller than the length of the fourth edge. The tongue 9 extends centrally from this edge of the electronic carrier 5 up to an area or field 10 of the thin film carrier 1, where an optocarrier, not shown in the figure, is to be mounted. The area 10 is here the outermost part of the tongue 9, the tongue 9 and the optocarrier area 10 thus having the same width. On the tongue 9 electrical conductors 11 are provided extending in parallel with each other and with the edges of the tongue 9 from the edge of the electronic circuit carrier 5 to the outermost part of the tongue 9, up to the area 10 reserved for an optocarrier. On the electronic circuit carrier 5 electronic circuits 13 are placed, such as for instance some suitable integrated circuit, and they are attached centrally at the electronic circuit carrier area 5 by means of for instance a suitable adhesive agent.

The electronic circuits 13 are electrically connected in a suitable manner to the legs 7 for electrical connection of the assembly to the exterior, and also to the electrical conductor paths 11 on the tongue 9. The electrical connection can be produced by means of "solder bumps" or islands of an electrically conducting adhesive, which before the connection are placed on suitably shaped electrically conducting surfaces on the electrical circuit carrier area 5. The bumps or islands are then heated, when the electrical circuits 13 are located at the correct place having their electrical connection areas positioned above the "bumps" or the adhesive islands. As an alternative, wire bonding by means of connection wires, not shown, can of course be used, although this would demand a rather large amount of manual work.

Figure 1:
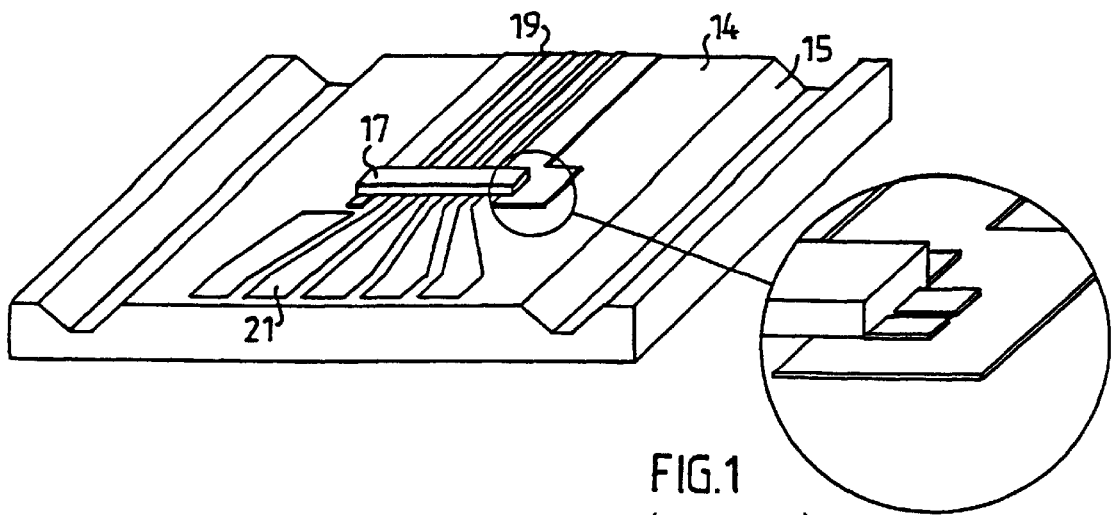
FIG. 1 shows a perspective view of an optocomponent carrier.

The optocarrier can be larger than the optocarrier area 10, which is reserved therefor on the tongue 9, and can be the prior art optocarrier 14 illustrated in FIG. 1. This optocarrier 14 comprises a rectangular plate of silicon, having parallel V-grooves 15 next to two opposite side edges. Inside, on the surface of the plate the very optoelectrical component 17 is located, which is mounted with an accurate optical connection to waveguides 19. The waveguides 19 are located on or in the surface of the optocarrier plate 14 and extend in parallel with the V-grooves 15 up to an edge of the plate 14. The electrical connection of the optocomponent 17 to electrode areas 21 also produced on the surface of the plate 14 can be accomplished in a suitable manner, for instance as conventional by wire bonding or in a preferred manner at the contact surface between the optocomponent 17, i.e. the underside thereof, and the optocarrier by means of the flip-chip method using suitably shaped and located solder islands or islands of a conducting adhesive.

The electrical contact between the electrode surfaces 21 on the optocomponent carrier 14 and the electrical conductors 11 on the tongue 9 of the thin film carrier 1 can also be obtained by means of loose or separate, individual bonded wires 22, as is schematically shown in FIG. 3c. Here it is also shown that the electrical conductors 11 in this case are located on top of a polymer layer 9' of the tongue and that the area 10 on the tongue, where the optocomponent carrier is mounted, only extends a short distance under the optocomponent carrier 14, where a joint 10' of an adhesive retains the optocomponent carrier 14.

As an alternative and in a preferred manner the electrical connection of the optocomponent carrier 14 can be performed by means of a direct connection of the electrically conductive paths 11 on the tongue 9 to the electrode areas 21 on the optocomponent carrier 14, as is schematically shown in FIG. 3d. This embodiment requires that the electrical conductors 11 on the tongue 9 are arranged on the underside thereof, on the underside of the polymer layer 9". The joints 22' between the conduction paths 11 and the electrode areas 21 can be obtained by means of conventional soldering, "TAB connection", which is essentially performed like wire bonding by means of a suitable welding operation but without loose wires, or by means of an electrically conductive adhesive. The joints 22' can at the same time maintain the entire optocomponent carrier 14 fixed at the area 10 of the tongue 14.

Cross-sections of an encapsulated component 25 or equivalently a mould cavity having a thin film carrier 1 and optocarrier 15 arranged therein are shown in FIGS. 3a and 3b. The frame portion 5 of the thin film carrier 1 is here removed, so that the legs 7 for electrical connection of the electronic circuits 13 protrude from the capsule 25. Guide pins 27 are inserted in guide holes in the capsule 25 and are placed well in contact in the guide grooves 17 on the optocarrier 15. The optocarrier 15 is placed having one of its surfaces, where the waveguides 21 end, at a side of the capsule 25.

By the fact that the tongue 9 is made of a thin flexible polymer material, the length of the tongue 9 does not need to be too accurately determined, as long as the tongue is a little longer than what can be required during positioning of at least parts of the entire assembly in a mould cavity. The tongue 9 can, as is shown in the side view in FIG. 3b, be curved or bent between the electronic circuit carrier portion 5 and the field 10 of the tongue 9, which is reserved for the optocarrier 14 and to which this is adhesively bonded.

Figure 4:
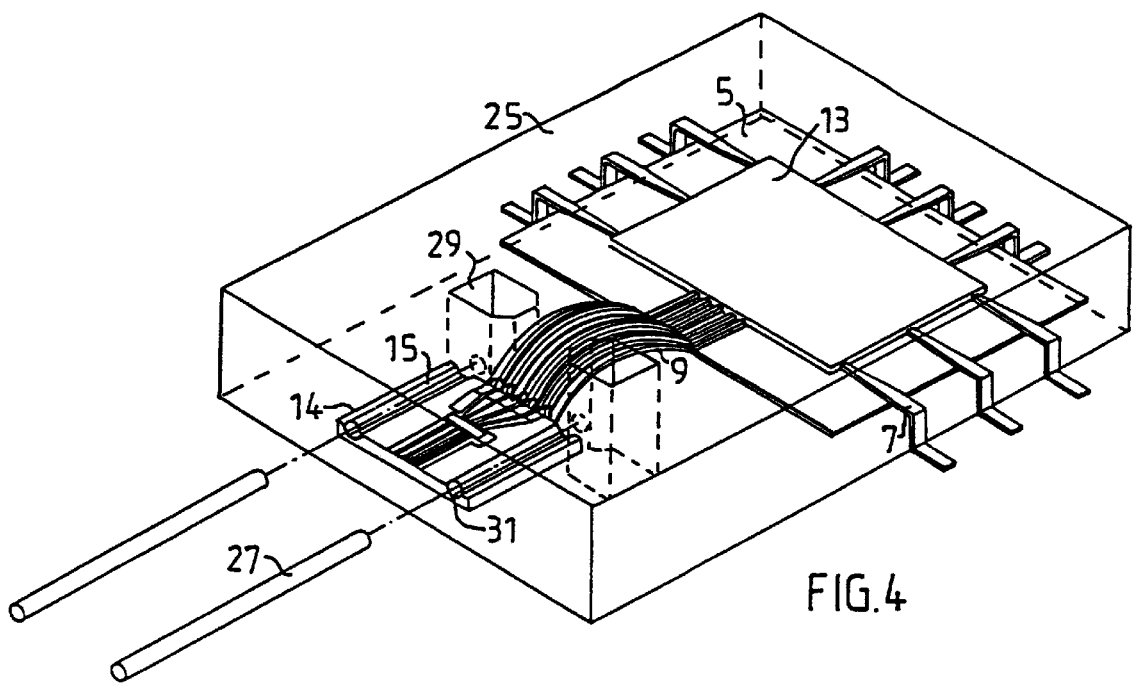
FIG. 4 shows a perspective view of the thin film carrier comprising components and arranged in a capsule.

The encapsulated component 25 is also shown in the perspective view of FIG. 4. Here the legs 7 are folded downwards at the outside of the package or capsule 25 having outer portions bent so that they are located in the same plane as the underside of the package 25. Hereby an electrical connection can be obtained to an underlying circuit board by means of some suitable method such as surface mounting. Furthermore, in this view holes 29 are visible, which pass through the capsule and have been formed during the moulding of the plastic capsule due to supports for the guide pins 15, see the International patent applications for the same applicant/assignee cited above. The guide holes 31 for the guide pins 27 then extend all the way to the transverse holes 29.

Figure 5:
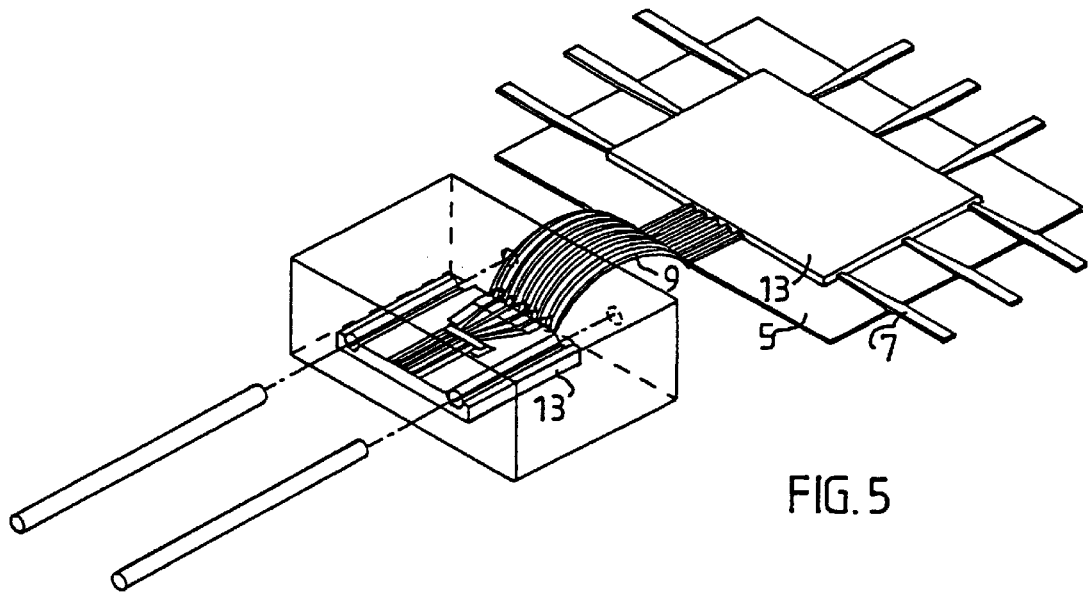
FIG. 5 shows an alternative embodiment of the capsule having a freely located part for driver electronic circuits.

In FIG. 5 an alternative mounting method is illustrated, where only the front portion of the thin film carrier 1, namely the front end portion comprising the area 10 of the tongue 9, which is reserved for the optocarrier, and the portion of the tongue 9, which is located adjacent to this area, and the optocarrier 14 having a component arranged thereon have been moulded into a plastic material. The electronic circuit carrier 5 having electronic circuits 13 mounted thereupon is here not protected by the plastic package but must be protected in another manner, for instance by "globe-top" encapsulation. The advantage of such a module comprising an encapsulated optocomponent and an electronic driver unit connected by a flexible means, is that the optocomponent can be displaced in relation to the electronic part of the component that is rigidly attached to a circuit board, what will considerably facilitate that the optocomponent capsule and in particular its optical interface can be placed in the exactly correct position on the circuit board for connection to some other device having a similar or corresponding optical interface.

What is claimed is:

1. An encapsulated optoelectrical component, comprising:
    an optocomponent assembly having a side or edge and an optical interface at the side or edge, the optocomponent assembly having areas for electrical connection and mechanical guide devices for positioning the optocomponent assembly in relation to another optical device having corresponding mechanical guide devices,
    an electrical circuit unit for cooperation with the optocomponent assembly and having areas for electrical connection,
    a plate-shaped carrier comprising an insulating material, the carrier comprising:
        a first area for attachment of the optocomponent assembly,
        a second area for attachment of the electrical circuit unit,
        electrical conductors for electrical connection to
            the areas of the optocomponent assembly,
            the areas of the electrical circuit unit, and
            the exterior,
    an encapsulating enclosure enclosing a main part of the optocomponent assembly or the electrical unit, the plate-shaped carrier, and the main part of the optocomponent assembly, the optocomponent assembly being located having the side or edge of the optocomponent assembly having the optical interface coinciding with a surface of the encapsulating enclosure,
    wherein the second area of the plate-shaped carrier for attachment of the optocomponent assembly is connected to the first area through a flexible portion of the carrier, the flexible portion substantially extending from the first area of the carrier for attachment of the electrical circuit unit and comprising electrical conductors arranged thereupon for conducting electrical drive voltages to and signals to and/or from the optocomponent assembly, the flexible portion of the carrier positioning, in an encapsulating operation for making the encapsulating enclosure, if the encapsulating enclosure encloses the main part of the optocomponent assembly, the electrical unit and the plate-shaped carrier, the optocomponent assembly at an accurately defined position in relation to a part of the component containing the electrical circuit unit, or if the encapsulating enclosure encloses only the optocomponent assembly, moving the optocomponent assembly in relation to the part of the component containing the electrical circuit unit, said part mountable to a circuit board, thereby positioning the optocomponent assembly and the optical interface in a correct position on the circuit board.

2. The encapsulated optoelectrical component of claim 1, wherein the mechanical guide devices of the optocomponent assembly comprise parallel guide grooves formed on the optocomponent assembly for engagement with guide pins.

3. The encapsulated optoelectrical component of claim 1, wherein the flexible portion is considerably more narrow and/or considerably thinner than an area of the carrier, from which the flexible portion extends.

* * * * *